(12) United States Patent
Yu

(10) Patent No.: US 12,198,914 B2
(45) Date of Patent: Jan. 14, 2025

(54) SEMICONDUCTOR APPARATUS AND MAGNETIC STRUCTURE OF SEMICONDUCTOR APPARATUS

(71) Applicant: BEIJING NAURA MICROELECTRONICS EQUIPMENT CO., LTD., Beijing (CN)

(72) Inventor: Zhenduo Yu, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 45 days.

(21) Appl. No.: 18/045,087

(22) Filed: Oct. 7, 2022

(65) Prior Publication Data

US 2023/0055004 A1    Feb. 23, 2023

Related U.S. Application Data

(63) Continuation of application No. PCT/CN2021/083787, filed on Mar. 30, 2021.

(30) Foreign Application Priority Data

Apr. 7, 2020   (CN) .......................... 202010265299.9

(51) Int. Cl.
*H01J 37/34*   (2006.01)

(52) U.S. Cl.
CPC ...... *H01J 37/3455* (2013.01); *H01J 37/3405* (2013.01); *H01J 37/3461* (2013.01)

(58) Field of Classification Search
None
See application file for complete search history.

(56) References Cited

U.S. PATENT DOCUMENTS

| 5,902,461 A | 5/1999 | Xu et al. |
| 6,351,075 B1 * | 2/2002 | Barankova .......... H01J 37/3266 118/723 MR |

(Continued)

FOREIGN PATENT DOCUMENTS

| CN | 103374705 A | 10/2013 |
| CN | 104121811 A | 10/2014 |

(Continued)

OTHER PUBLICATIONS

Kangmin Wei, "Machining Technology", Xi'an University Press, Jan. 31, 2006, pp. 291.

(Continued)

*Primary Examiner* — Jason Berman
(74) *Attorney, Agent, or Firm* — ANOVA LAW GROUP, PLLC

(57) ABSTRACT

A magnetic structure in a semiconductor apparatus is arranged outside of a reaction chamber of the semiconductor apparatus and includes an annular support member, a plurality of angle adjustment assemblies, and a plurality of magnetic members. The annular support member is arranged around the reaction chamber of the semiconductor apparatus. The plurality of angle adjustment assemblies are connected to the annular support member and distributed along a circumferential direction of the annular support member. The plurality of magnetic members are connected to the plurality of angle adjustment assemblies in a one-to-one correspondence. An angle adjustment assembly of the angle adjustment assemblies is configured to fix a corresponding magnetic member of the plurality of magnetic members at the annular support member and adjust a magnetic field line direction of the magnetic member and a magnitude of an included angle.

18 Claims, 8 Drawing Sheets

(56) References Cited

U.S. PATENT DOCUMENTS

2001/0032783 A1    10/2001  Gopalraja et al.
2004/0020768 A1     2/2004  Wang et al.
2004/0196127 A1 *  10/2004  Perrin ................ H01J 37/3455
                                                          335/299

FOREIGN PATENT DOCUMENTS

CN    105603370 A    7/2016
CN    105779949 A    7/2016
CN    111411338 A    7/2020

OTHER PUBLICATIONS

The World Intellectual Property Organization (WIPO) International Search Report for PCT/CN2021/083787 Jun. 18, 2021 5 Pages (including translation).

* cited by examiner

SEMICONDUCTOR APPARATUS AND MAGNETIC STRUCTURE OF SEMICONDUCTOR APPARATUS

CROSS-REFERENCES TO RELATED APPLICATIONS

This application is a continuation of International Application No. PCT/CN2021/083787, filed on Mar. 30, 2021, which claims priority to Chinese Application No. 202010265299.9 filed on Apr. 7, 2020, the entire content of all of which are incorporated herein by reference.

TECHNICAL FIELD

The present disclosure generally relates to the integrated circuit manufacturing apparatus field and, more particularly, to a semiconductor apparatus and a magnetic structure of the semiconductor apparatus.

BACKGROUND

In a subsequent process of integrated circuit chip preparation, magnetron sputtering of physical vapor deposition (hereinafter referred to as PVD) technology is one of the most widely used technologies. Metal interconnection, hard masks, and packaging all need to use PVD technology. In general, the magnetron sputtering is a deposition of a thin film material on a wafer. For example, an Al metal thin film used as a metal interconnection wire is deposited. In recent years, importance and challenge of depositing dielectric and metal layers using vertical interconnection technology has become increasingly apparent in a through-hole with a high depth and width ratio. This situation is changed by Cu metal interconnection. Since a Cu metal layer has relatively low resistivity and good resistance to electromigration, circuit stability is enhanced. Meanwhile, a low-k dielectric material replaces silicon dioxide to become an insulation medium between metal layers, which reduces parasitic capacitance between metal interconnection layers. Thus, the speed of integrated circuits may be greatly improved.

SUMMARY

Embodiments of the present disclosure provide a magnetic structure in a semiconductor apparatus. The magnetic structure is arranged outside of a reaction chamber of the semiconductor apparatus and includes an annular support member, a plurality of angle adjustment assemblies, and a plurality of magnetic members. The annular support member is arranged around the reaction chamber of the semiconductor apparatus. The plurality of angle adjustment assemblies are connected to the annular support member and distributed along a circumferential direction of the annular support member. The plurality of magnetic members are connected to the plurality of angle adjustment assemblies in a one-to-one correspondence. An angle adjustment assembly of the angle adjustment assemblies is configured to fix a corresponding magnetic member of the plurality of magnetic members at the annular support member and adjust a magnetic field line direction of the magnetic member and a magnitude of an included angle between a magnetic field line of the magnetic member and an axis of the reaction chamber.

Embodiments of the present disclosure provide a semiconductor apparatus, including a reaction chamber and a magnetic structure arranged around outside of the reaction chamber. The magnetic structure includes an annular support member, a plurality of angle adjustment assemblies, and a plurality of magnetic members. The annular support member is arranged around the reaction chamber of the semiconductor apparatus. The plurality of angle adjustment assemblies are connected to the annular support member and distributed along a circumferential direction of the annular support member. The plurality of magnetic members are connected to the plurality of angle adjustment assemblies in a one-to-one correspondence. An angle adjustment assembly of the angle adjustment assemblies is configured to fix a corresponding magnetic member of the plurality of magnetic members at the annular support member and adjust a magnetic field line direction of the magnetic member and a magnitude of an included angle between a magnetic field line of the magnetic member and an axis of the reaction chamber.

The beneficial effects of the present disclosure.

In the magnetic structure in the semiconductor apparatus provided by embodiments of the present disclosure, a plurality of angle adjustment assemblies are connected to the annular support member and are distributed along a circumferential direction of the annular support member. The angle adjustment assembly can fix the corresponding magnetic member on the annular support member and is configured to adjust the magnetic field line direction of the magnetic member and the included angle between the magnetic field line and the axis of the reaction chamber can be adjusted. Thus, an effect range of the magnetic field on the wafer surface can be adjusted, which can not only improve the process result but also meet different process requirements.

The semiconductor apparatus of embodiments of the present disclosure can not only improve the process result but also meet different process requirements by adopting the above-mentioned magnetic structure provided by embodiments of the present disclosure.

Other features and advantages of the present disclosure are described in detail in the detailed description as follows.

BRIEF DESCRIPTION OF THE DRAWINGS

The present disclosure is described in more detail below with reference to the accompanying drawings. Although preferred embodiments of the present disclosure are shown in the accompanying drawings, the present disclosure may be implemented in various forms and should not be limited by the described embodiments here. On the contrary, these embodiments are provided to cause the present disclosure more thorough and complete, and the scope of the present disclosure can be fully conveyed to those skilled in the art.

DETAILED DESCRIPTION OF THE EMBODIMENTS

Preferred embodiments of the present disclosure are described in more detail below. Although preferred embodiments of the present disclosure are described below, the present disclosure can be implemented in various forms and should not be limited by embodiments described here. On the contrary, embodiments are provided to make the present disclosure more thorough and complete and can fully convey the scope of the present disclosure to those skilled in the art.

Figure 1:
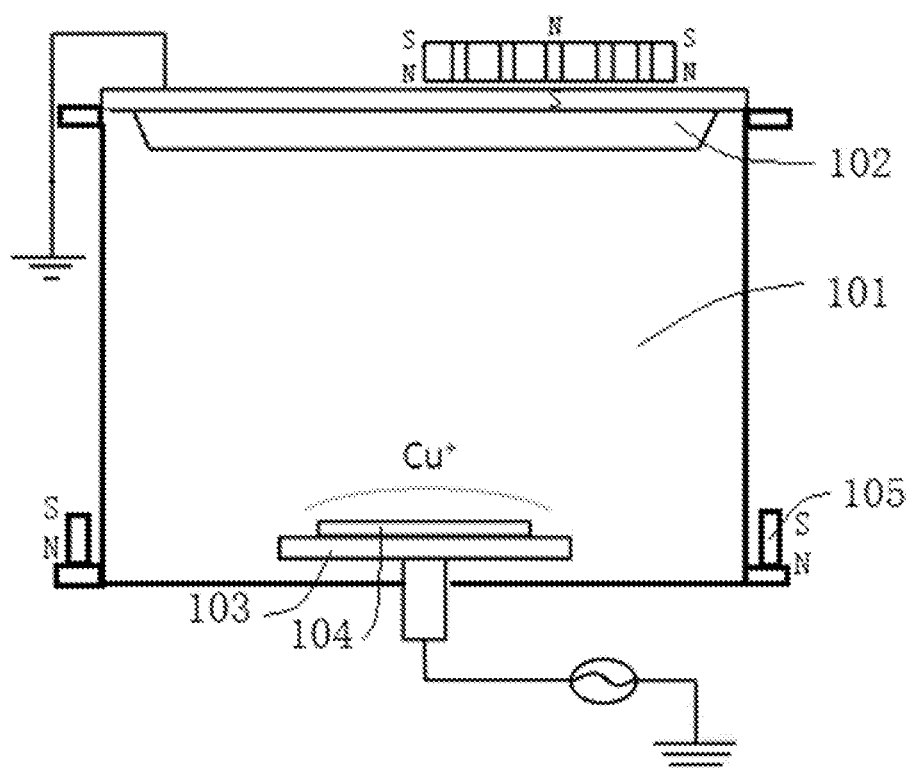
FIG. 1 is a schematic structural diagram of an existing physical vapor deposition (PVD) apparatus for preparing a copper interconnection layer.

FIG. 1 is a schematic structural diagram of a physical vapor deposition (PVD) apparatus for preparing a copper interconnection layer. As shown in FIG. 1, the PVD apparatus includes a reaction chamber 101. A target material 102 is arranged at a top of the reaction chamber 101. A base 103 is arranged below the target material in the reaction chamber 101 and is configured to carry a wafer 104. Moreover, an edge magnet structure 105 is arranged around the outside of the reaction chamber 101. A confinement effect of a magnetic field in the reaction chamber 101 on copper ions can be adjusted by the edge magnet structure 105. Thus, the copper ions can be more uniformly distributed on the wafer surface to improve the performance of the copper thin film.

Figure 2:
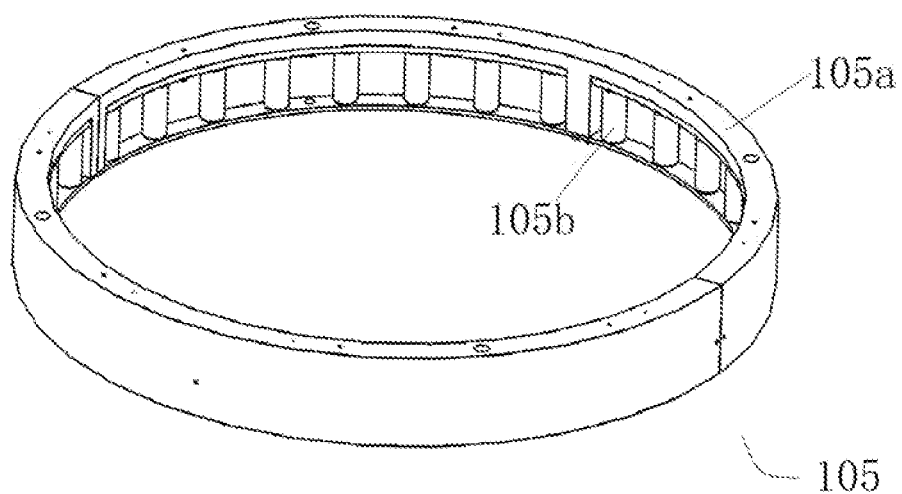
FIG. 2 is a schematic structural diagram showing an edge magnet structure shown in FIG. 1.

In some embodiments, as shown in FIG. 2, the above-mentioned edge magnet structure 105 includes an annular frame 105*a* and a plurality of column-shaped magnets 105*b* fixed on the annular frame 105*a*. The plurality of column-shaped magnets 105*b* are arranged at intervals along a circumferential direction of the annular frame 105*a*. An axial direction (magnetic field line) of each column-shaped magnet 105*b* is in parallel with an axial direction of the annular frame 105*a*.

The above-mentioned edge magnet structure 105 inevitably has the following problems in practical applications, that is, a number and position of the column magnets 105*b* installed in the annular frame 105*a* are fixed. Thus, a single process result is resulted, which cannot meet different process requirements.

Embodiments of the present disclosure provide a magnetic structure in a semiconductor apparatus. The magnetic structure may be arranged around the outside of the reaction chamber of the semiconductor apparatus. The semiconductor apparatus may be, for example, a magnetron sputtering apparatus, which is configured to deposit a thin film on a wafer surface. By taking a copper thin film that is used as the copper interconnection layer as an example, with the magnetic structure, the magnetic field in the reaction chamber may constrain copper ions. Thus, the copper ions may be more uniformly distributed on the wafer surface to improve the performance of the copper thin film.

Figure 3:
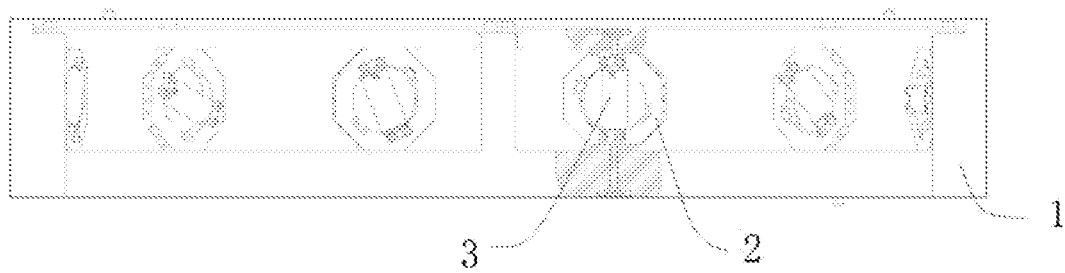
FIG. 3 is a schematic partial diagram showing a magnetic structure in the semiconductor apparatus according to some embodiments of the present disclosure.

In some embodiments, with reference to FIG. 3, the above-mentioned magnetic structure includes an annular support member 1, a plurality of angle adjustment assemblies 2, and a plurality of magnetic members 3. The annular support member 1 is arranged around the reaction chamber of the above-mentioned semiconductor apparatus. The plurality of angle adjustment assemblies 2 may be connected to the annular support member 1 and distributed along a circumferential direction of the annular support member 1. The magnetic members 3 are connected to the angle adjustment assemblies 2 in a one-to-one correspondence. The angle adjustment assembly 2 can be configured to fix the corresponding magnetic member 3 at the annular support member 1 and configured to adjust the direction of the magnetic field line of the magnetic member 3 and a size of the included angle between the magnetic field line and the axis of the reaction chamber. For example, FIG. 3 shows a cylindrical magnetic member 3. An axis of the cylindrical magnetic member 3 is the above-mentioned magnetic field line. "N" marked on the magnetic member 3 is an N pole of the magnetic member 3, and "S" marked on the magnetic member 3 is an S pole of the magnetic member 3. The direction of the magnetic field line may refer to a direction from the N pole to the S pole. That is, the magnetic field lines of the magnetic member 3 and a magnitude of an included angle between the direction of the magnetic field line of the magnetic member 3 and the axis of the reaction chamber between the magnetic field line and the axis of the reaction chamber are adjusted. The direction of the magnetic member 3 from the N pole to the S pole and the magnitude of the included angle between the axis of the magnetic member 3 and the axis of the reaction chamber may be adjusted.

The direction of the magnetic field line of the magnetic member 3 and the magnitude of the included angle between the magnetic field line and the axis of the reaction chamber may be adjusted with help of the angle adjustment assembly 2. The intensity of the magnetic field and the direction of the magnetic field in the reaction chamber may be adjusted to adjust an effect range of the magnetic field on the wafer surface to further improve the process result and meet different process requirements. By taking the preparation of the copper thin film used as a copper interconnection layer as an example, the magnetic structure of embodiments of the present disclosure can adjust the effect range of the magnetic field on the wafer surface by adjusting the direction of the magnetic field lines and the magnitude of the included angle between the magnetic field lines and the axis of the reaction chamber. Thus, the confinement effect of the magnetic field in the reaction chamber on the copper ions may be improved to cause the copper ions to be more uniformly distributed on the wafer surface to improve the performance of the copper thin film.

The above-mentioned magnetic member 3 may be, for example, a permanent magnet or an electromagnet. The magnetic member 3 may be, for example, a cylinder or another columnar structure. However, in practical applications, the magnetic member 3 may further adopt a structure of any other shapes, which is not limited by embodiments of the present disclosure.

Figure 4:
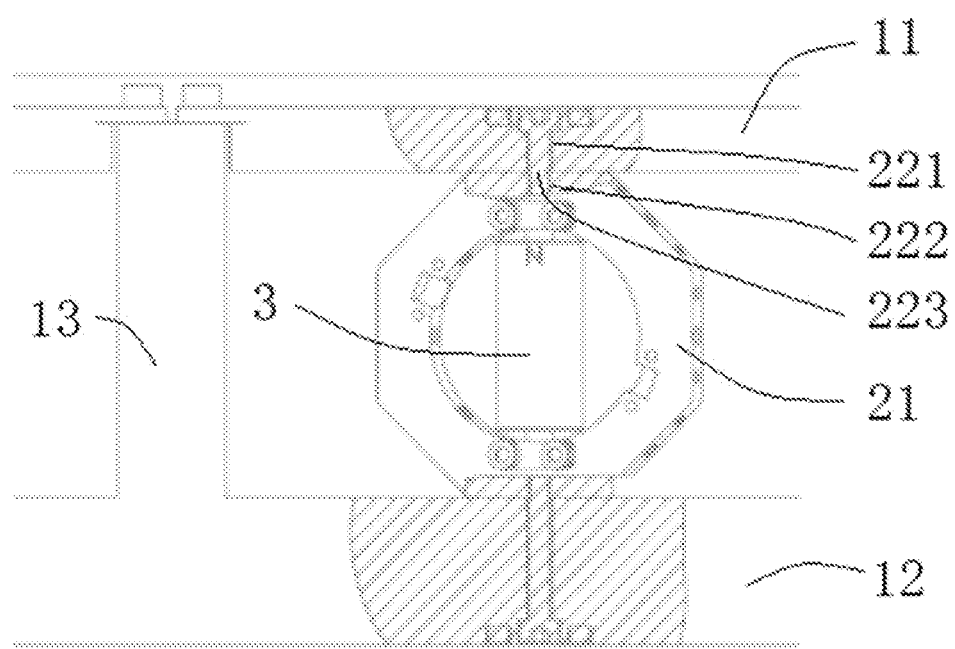
FIG. 4 is a schematic partial enlarged diagram of a magnetic structure according to some embodiments of the present disclosure.

The above-mentioned annular support member 1 may have various structures. For example, as shown in FIG. 4, the above-mentioned annular support member 1 includes an upper ring frame 11, a lower ring frame 12, and a connection member 13. The upper ring frame 11 and the lower ring frame 12 are arranged opposite to each other in a vertical direction and are parallel to each other. The connection member 13 may be supported between the upper ring frame 11 and the lower ring frame 12. The connection member 13 is detachably connected to the upper ring frame 11 and/or the lower ring frame 12. The connection member 13 may be detachably connected to the upper ring frame 11 and/or the lower ring frame 12, which facilitates adjustment of the direction of the magnetic field lines of the magnetic members 3 and adjustment of the distribution quantity and position of the magnetic members 3. Thus, the flexibility of the adjustment may be improved to meet different process requirements.

In some embodiments, in order to further improve the connection stability, an end of the connection member 13 may be integrally formed with the upper ring frame 11 or the lower ring frame 12. The other end of the connection member 13 may be detachably connected to the lower ring frame 12 or the upper ring frame 11. For example, the connection member 13 may be fixedly connected by a threaded connection through fasteners. Thus, the stability of the positional fixation between the upper ring frame 11 and the lower ring frame 12 can be improved.

Figure 5A:
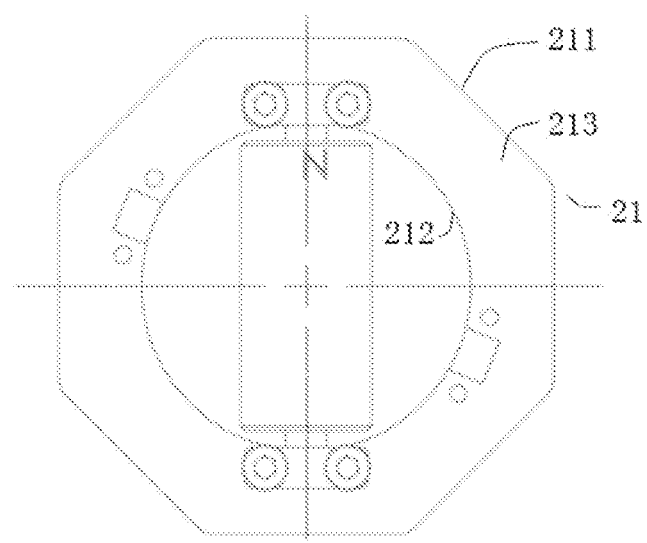
FIG. 5A is a schematic structural diagram of a support body according to some embodiments of the present disclosure.

The above-mentioned angle adjustment assembly 2 may have a plurality of structures. For example, as shown in FIG. 4, each angle adjustment assembly 2 includes a support body 21. The support body 21 is located between the upper ring frame 11 and the lower ring frame 12 and configured to support the magnetic member 3. As shown in FIG. 5A, the support body 21 has an outer peripheral surface 211. As shown in FIG. 4, on the outer peripheral surface 211, a plurality of first mounting holes 222 are arranged at intervals along a circumferential direction of the support body 21. A second mounting hole 221 is arranged on an annular support member 1. In some embodiments, as shown in FIG. 4, corresponding to each angle adjustment assembly 2, the second mounting hole 221 is arranged at least on one of two surfaces of the upper ring frame 11 and the lower ring frame 12 that are opposite to each other. In addition, each angle adjustment assembly 2 further includes a first fastener 223 which is configured to fix the support body 21 on the annular support member 1. In some embodiments, the support body 21 is fixed by the first fastener 223 between the upper ring frame 11 and the lower ring frame 12. In addition, the first fastener 223 can be installed in any one of the first mounting holes 222 and the second mounting holes 221. The magnetic field line of the magnetic member 3 and the magnitude of the included angle between the magnetic field line of the magnetic member 3 and the axis of the reaction chamber can be adjusted by positioning the first fastener 223 in different first mounting holes 222.

In a process of installing the support body 21, firstly, the first mounting hole 222 and the second mounting hole 221 that correspond to the desired magnetic field line direction and the included angle may be coaxially arranged. Then, the first fastener 223 may be arranged in the first mounting hole 222 and the second mounting hole 221, which are coaxially arranged. That is, the support body 21 and the annular support member 1 may be fixedly connected. Meanwhile, the magnetic member 3 of the support body 21 may be fixed at a position corresponding to the desired magnetic field line direction and the included angle.

In some embodiments, the first fastener 223 may be, for example, a screw. At least one of the first mounting holes 222 and the second mounting holes 221 may be a threaded hole.

In some embodiments, as shown in FIG. 4, the above-mentioned second mounting holes 221 are provided on both surfaces of the upper ring frame 11 and the lower ring frame 12 opposite to each other to improve the support stability for the support body 21. However, embodiments of the present disclosure are not limited to this. In practical applications, the above-mentioned second mounting holes 221 may only be arranged on the upper ring frame 11 or the lower ring frame 12. Thus, the support body 21 may be fixed between the upper ring frame 11 and the lower ring frame 12 by the first fasteners 223. A number of the first fasteners 223 may be the same as a number of the above-mentioned second mounting holes 221, and the first fasteners 223 and the second mounting holes 221 may be arranged in a one-to-one correspondence.

Figure 5B:
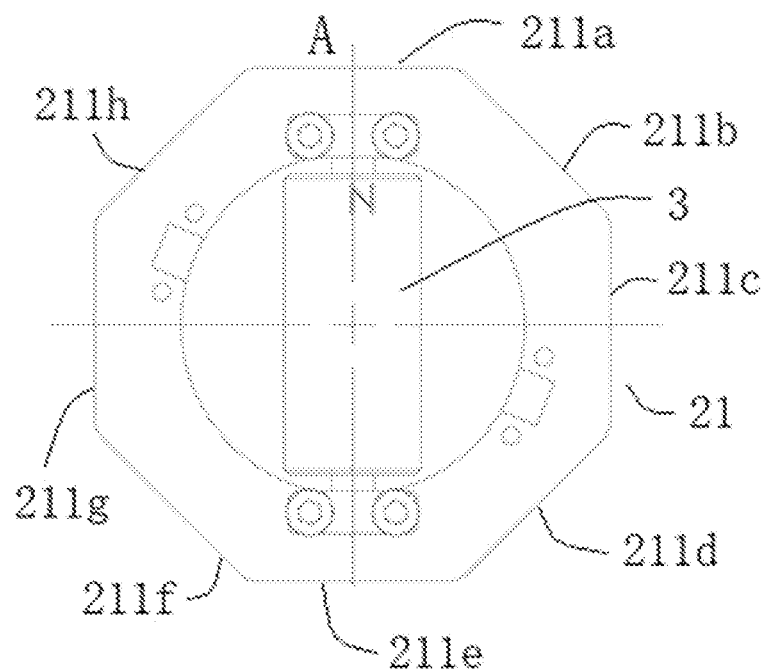
FIG. 5B is a schematic structural diagram of another support body according to some embodiments of the present disclosure.
Figure 5C:
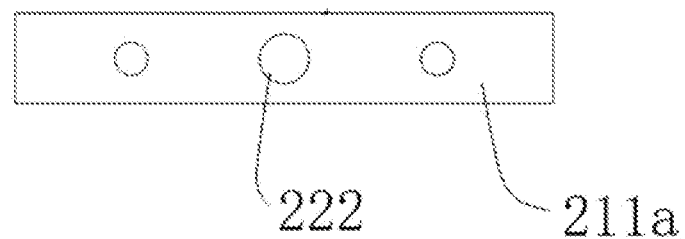
FIG. 5C is a schematic top view of a sub-plane according to some embodiments of the present disclosure.
Figure 8:
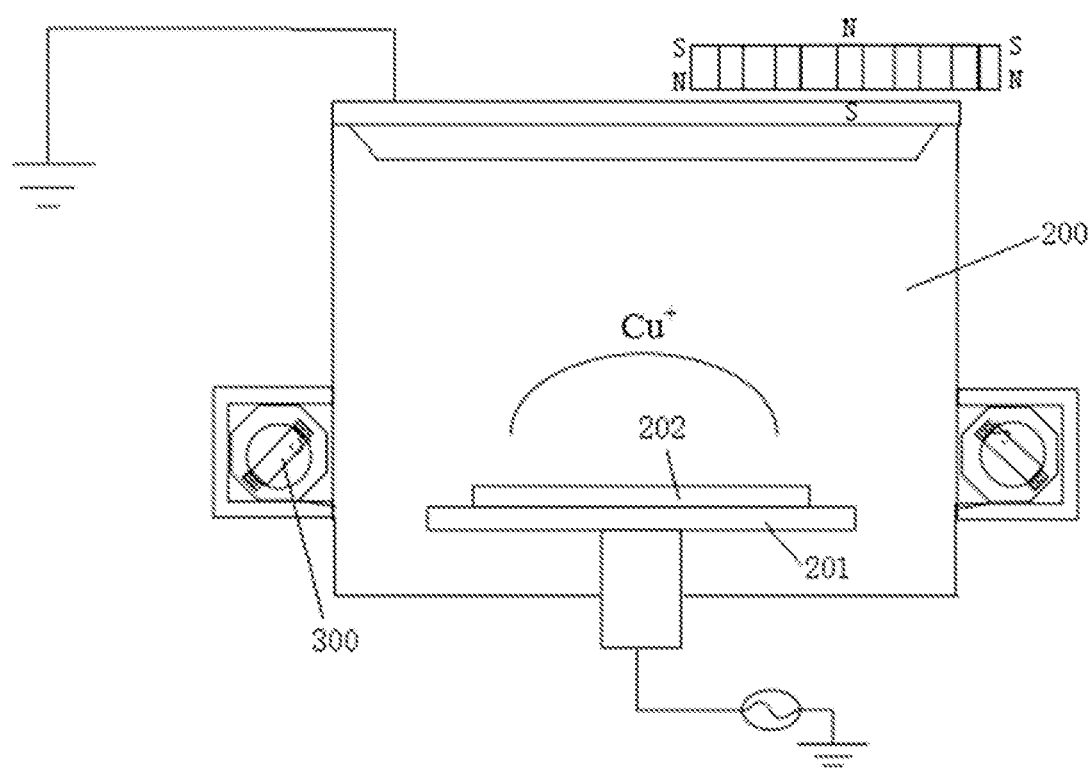
FIG. 8 is a schematic structural diagram showing a semiconductor apparatus according to some embodiments of the present disclosure.

In order to further improve the connection stability, in some embodiments, the outer peripheral surface 211 includes a plurality of sub-planes arranged in sequence along the circumferential direction of the outer peripheral surface 211. For example, as shown in FIG. 5B, 8 sub-planes are included and are respectively sub-planes (211a-211h). Furthermore, as shown in FIG. 5C, taking the sub-plane 211a as an example, each sub-plane is provided with the above-mentioned first mounting holes 222. In some embodiments, a number of the above-mentioned first mounting holes 222 on each sub-plane may be one or more. Thus, by selecting different first mounting holes 222 on the same sub-plane, the position of the support body 21 on the sub-plane can be adjusted to further improve the adjustment flexibility.

In some embodiments, the magnetic member 3 may be cylindrical (e.g., cylinder shape). The support body 21 may be a regular polygonal prism structure. The plurality of sub-planes may form regular polygonal surfaces, such as regular triangular surfaces, regular hexagonal surfaces, regular octagonal surfaces, etc. A size ratio of the regular polygon may be symmetrical, and an included angle between two neighboring sub-planes may be the same, which facilitates the adjustment of the included angle between the magnetic field line of each magnetic member and the axis of the reaction chamber. For example, all the magnetic members 3 may be facilitated to be fixed in the same magnetic field line direction and/or the above-mentioned included angle, which may increase the effect strength of the magnetic field on the wafer surface. Of course, in practical applications, according to different process requirements, the magnetic field line directions and/or the above-mentioned included angles of different magnetic members may also be different.

Figure 6:
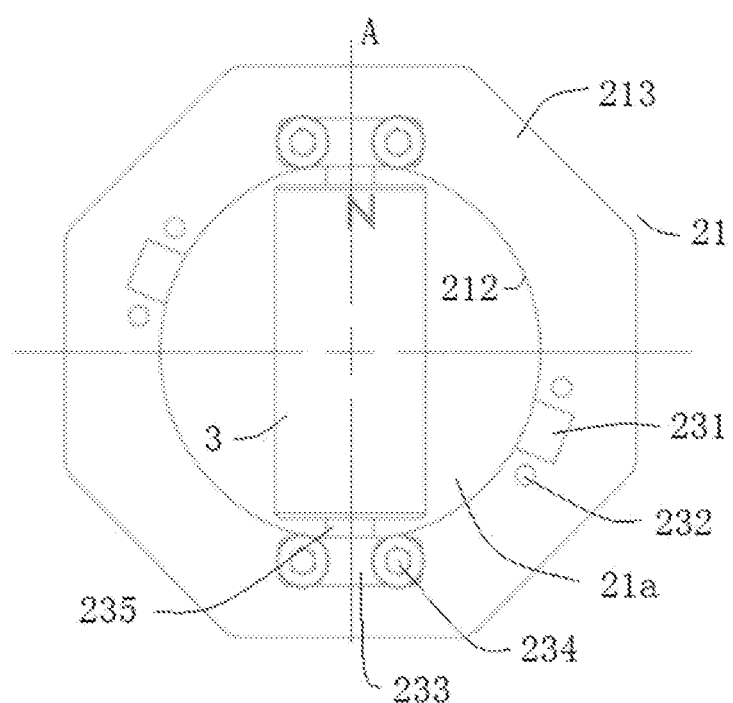
FIG. 6 is a schematic structural diagram showing a connection between a support body and a magnet member according to some embodiments of the present disclosure.

In order to further refine the angle adjustment accuracy, that is, to fix the magnetic member 3 in more different magnetic field line directions, in some embodiments, as shown in FIG. 6, accommodation space 21a is arranged in the support body 21. The magnetic member 3 is in the accommodation space 21a. In addition, the accommodation space 21a may include an outer peripheral surface 212. On the outer peripheral surface 212, a plurality of mounting grooves 231 are arranged at intervals along a circumferential direction of the outer peripheral surface 212. A mounting member 235 is arranged at a magnetic pole of the magnetic member 3. The mounting member 235 may be cooperated with any one of the mounting grooves 231 to fix the magnetic member 3 in the accommodation space 21a. By causing the mounting member 235 to cooperate with different mounting grooves 231, the magnetic field line direction of the magnetic member 3 and the magnitude of the included angle between the axis of the magnetic member 3 (magnetic field line) and the axis of the reaction chamber may be adjusted. When a relative position between the support body 21 and the annular support member 1 remains unchanged, the mounting member 235 of the magnetic member 3 may be cooperated with different mounting grooves 231, and the magnetic field line direction of the magnetic member 3 may be also different. For example, the magnetic member 3 may be fixed at a position of the magnetic field line A as shown in FIG. 6 or a position of the magnetic field line B as shown in FIG. 7.

In order to improve the connection stability of the magnetic member 3, in some embodiments, a plurality of mounting grooves 231 may be arranged in pairs. Each pair of mounting grooves may be opposite to each other. For example, FIG. 6 and FIG. 7 show four mounting grooves 231. The two mounting grooves 231 on magnetic field line A are a pair and are arranged oppositely. The two mounting grooves 231 on magnetic field line B are a pair and are arranged oppositely. Thus, the mounting members 235 may be arranged on two magnetic poles of the magnetic member 3. The two mounting members 235 may be cooperated with any pair of mounting grooves 231, respectively. Of course, in practical applications, the mounting member 235 may also be provided only on one of the magnetic poles of the magnetic member 3. As such, the magnetic member 3 may also be fixedly connected to the support body 21.

Figure 7:
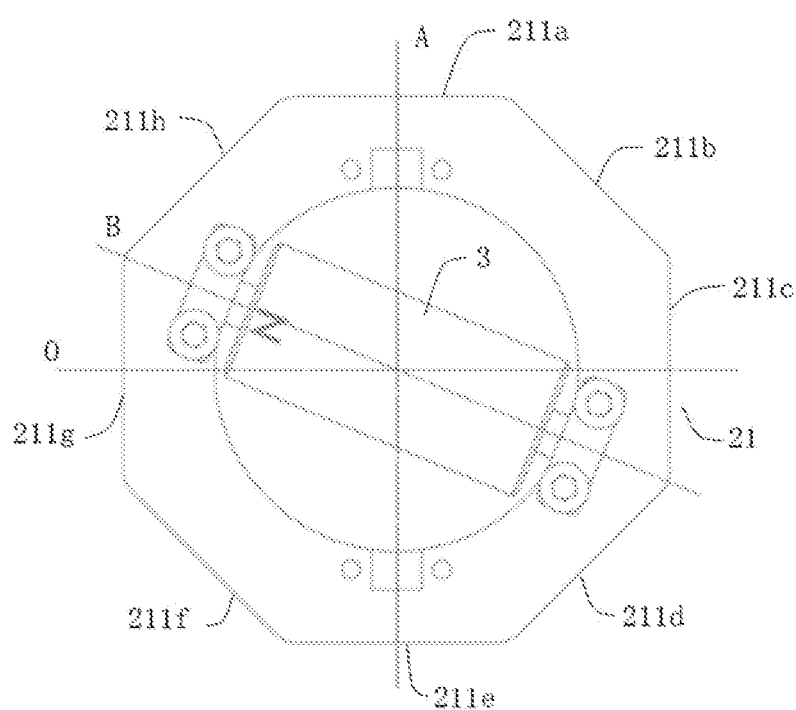
FIG. 7 is a schematic structural diagram showing another connection between a support body and a magnet member according to some embodiments of the present disclosure.

In some embodiments, as shown in FIG. 6 and FIG. 7, taking 8 sub-planes (211a-211h) as an example, when the sub-plane 211a faces upwards, magnetic field line A is in the vertical direction. An included angle between magnetic field line B and magnetic field line A is 67.5°, and an included angle between magnetic field line B and horizontal direction O is 22.5°. When the magnetic member 3 is fixed at the position of magnetic field line B as shown in FIG. 7, the support body 21 may be rotated clockwise with the angle where the support body 21 of FIG. 7 is located as the initial angle. When the sub-planes 211h, 211g, 211f, 211e, 211d, 211c, and 211b face upwards, respectively, included angles between magnetic field line B and horizontal direction O are 82.5°, 112.5°, 157.5°, 202.5°, 247.5°, 292.5°, and 337.5°. Thus, the above-mentioned magnetic field line B can be selected from the above-mentioned eight magnetic field lines. Further, by arranging different magnetic poles in different mounting members, the magnetic field line direction of the magnetic member 3 can be adjusted on different magnetic field lines.

When the magnetic member 3 is fixed at the position of magnetic field line A as shown in FIG. 6, the support body 21 is rotated along a clockwise direction by using the angle where the support body 21 in FIG. 6 (the included angle between horizontal direction O is 90°) as the initial angle. When the sub-planes 211h, 211g, 211f, 211e, 211d, 211c, and 211b face upwards, respectively, the included angles between magnetic field lines A and horizontal direction O are 135°, 180°, 225°, 270°, 315°, 0°, and 45° in sequence. Therefore, above-mentioned magnetic field line A can be selected from the above-mentioned eight magnetic field lines. Further, by arranging different magnetic poles in different mounting members, the magnetic field line direction of the magnetic member 3 can be adjusted on the same magnetic field line.

By fixing the magnetic member 3 at the position of magnetic field line A as shown in FIG. 6 or the position of magnetic field line B as shown in FIG. 7, the magnetic member 3 can be fixed in 16 different positions of the magnetic field line. In addition, by arranging different magnetic poles in different mounting members, the magnetic field line direction of the magnetic member 3 can be adjusted on the same magnetic field line.

A plurality of fixing manners of the mounting member 235 and the mounting groove 231 may be included. For example, as shown in FIG. 6, the support body 21 has a side surface (such as a side surface 213 shown in FIG. 5A) neighboring to the inner peripheral surface (such as the inner peripheral surface 212 shown in FIG. 5A). An opening communicated with the mounting groove 231 may be formed on the side surface. The opening may be configured to move the mounting member 235 into or out of the mounting groove 231. Moreover, a position limiting structure may be arranged on the side surface and at the opening and may be configured to limit the magnetic member 3 in the mounting groove 231 to prevent the magnetic member 3 from being moved out of the mounting groove 231.

The above position limiting structure may have a plurality of structures. For example, as shown in FIG. 6, the position limiting structure includes a position limiting member 233 and two second fasteners 234. The position limiting member 233 may be stacked on the above-mentioned side surface (e.g., side surface 213 shown in FIG. 5A) and block the above-mentioned opening. Two third mounting holes 232 may be arranged on the side surface and on two sides of the above-mentioned opening, respectively. Two fourth mounting holes (not shown in the figure) may correspondingly be arranged on the position limiting member 233. The two fourth mounting holes may be coaxially arranged with the two third mounting holes 232 respectively. Two second fasteners 234 may be in a one-to-one correspondence with the two third mounting holes 232. Each second fastener 234 may be mounted in the third mounting hole 232 and the fourth mounting hole coaxial with the third mounting hole 232 and may be configured to fixedly connect the position limiting member 233 to the support body 21. The above-mentioned position limiting member 233 may be, for example, a block piece. In practical applications, the position limiting member 233 and the support body 21 may also be fixedly connected in any other detachable manner, such as a snap connection, a plug connection, etc.

Installation steps of the above magnetic structure are as follows.

Step 1, the mounting member 235 is selected to be fixed in the mounting groove 231 corresponding to magnetic field line A shown in FIG. 6, or the two mounting members 235 are fixed in the mounting groove 231 corresponding to magnetic field line B shown in FIG. 7.

Step 2, one of the sub-planes of the support body 21 is caused to face a lower end surface of the upper ring frame 11 or an upper end surface of the lower ring frame 12, and make the first mounting hole 222 on the sub-plane to be coaxially arranged with the second mounting hole 221 of the upper ring frame 11 or the lower ring frame 12. Then, the first fastener 223 is mounted in the first mounting hole 222 and the second mounting hole that are coaxially arranged to fix the support body 21 at the annular support member 1.

Step 3, Step 1 and Step 2 are repeated until all the support bodies 21 and the magnetic members 3 on the support bodies 21 in the angle adjustment assemblies 2 are fixed on the annular support member 1 as shown in FIG. 3.

In summary, in the magnetic structure in the semiconductor apparatus of embodiments of the present disclosure, a plurality of angle adjustment assemblies may be connected to the annular support member and may be distributed along a circumferential direction of the annular support member. The magnetic members may be connected to the angle adjustment assemblies in a one-to-one correspondence. The angle adjustment assembly can fix the corresponding magnetic member on the annular support member and may be configured to adjust the magnetic field line direction of the magnetic member and the magnitude of the included angle between the magnetic field line and the axis of the reaction chamber. The magnetic field line direction of the magnetic member and the included angles may be different to adjust the magnetic field strength and magnetic field direction in the reaction chamber. Thus, the effect range of the magnetic field on the wafer surface can be adjusted, which can further improve the process result and meet different process requirements.

With reference to FIG. 8, embodiments of the present disclosure further provide a semiconductor apparatus, including a reaction chamber 200 and a magnetic structure 300. The reaction chamber 200 is provided with a base 201 that is configured to carry a wafer 202. The magnetic structure 300 is arranged around the outside of the reaction chamber 200, for example, near the surrounding of the base 201.

The above-mentioned semiconductor apparatus may be, for example, a magnetron sputtering apparatus, which is configured to deposit a thin film on a wafer surface. By taking preparation of a copper thin film used as a copper interconnection layer as an example, the confinement effect of the magnetic field generated by the magnetic structure 300 on copper ions can make the copper ions to be distributed more uniformly on the wafer surface. Thus, the performance of the copper thin film may be improved. Meanwhile, the magnetic structure 300 may change the direction and intensity of the magnetic field generated by the magnetic structure 300. Since copper atoms and copper ions in the chamber are normally distributed in a copper film coating process, the magnetic field generated by the magnetic structure 300 can realize the control of the distribution of the ions. When the magnetic field line direction of the magnetic member in the magnetic structure 300 and the included angle between the magnetic field line of the magnetic member in the magnetic structure 300 and the axis of the reaction chamber change, the ion distribution in the chamber may also change subsequently. The magntic field line direction and the magnitude of the included angle between the magnetic field line and the axis of the reaction chamber may be different to adjust the strength and direction of the magnetic field in the reaction chamber. For example, the magnetic field line direction of the magnetic member of the magnetic structure may be fixed, the larger the included angle between the magnetic field line of the magnetic member and the axis of the reaction chamber is, the thinner the thickness of the film is, and the poorer the uniformity is. According to the actual situation, the magnetic field line direction and the magnitude of the included angle between the magnetic field line and the axis of the reaction chamber may be adjusted to eventually realize the needed process requirements. For example, in process debugging, process uniformity and reverse sputtering rate may be important monitoring indicators, which can only be optimized by adjusting a target-base distance. Thus, a process window may be relatively narrow. By adjusting the magnetic field line direction of the magnetic member in the magnetic structure 300 and the magnitude of the included angle between the magnetic field line and the axis of the reaction chamber, the uniformity may also be optimized to widen the process window.

Embodiments of the present disclosure have been described above. The above description is exemplary, not exhaustive, and not limited to the disclosed embodiments. Modifications and variations are apparent to those of ordinary skill in the art without departing from the scope and spirit of the described embodiments.

What is claimed is:

1. A magnetic structure in a semiconductor apparatus, arranged outside of a reaction chamber of the semiconductor apparatus, comprising:
   an annular support member arranged around the reaction chamber of the semiconductor apparatus;
   a plurality of angle adjustment assemblies connected to the annular support member and distributed along a circumferential direction of the annular support member; and
   a plurality of magnetic members connected to the plurality of angle adjustment assemblies in a one-to-one correspondence, an angle adjustment assembly of the angle adjustment assemblies being configured to fix a corresponding magnetic member of the plurality of magnetic members at the annular support member and adjust a magnetic field line direction of the magnetic member and a magnitude of an included angle between a magnetic field line of the magnetic member and an axis of the reaction chamber;
   wherein an angle adjustment assembly of the plurality of angle adjustment assemblies includes:
      a support body including a plurality of first mounting holes along a circumferential direction, and a second mounting hole at the annular support member, and
      a first fastener being placed in any one of the first mounting holes and the second mounting hole to adjust the magnetic field line direction of the magnetic member and the magnitude of the included angle between the magnetic field line of the magnetic member and the axis of the reaction chamber.

2. The magnetic structure according to claim 1, wherein the angle adjustment assembly includes:
   the support body configured to support the magnetic member and including an outer peripheral surface, and on the outer peripheral surface, the plurality of first mounting holes being arranged at intervals along a circumferential direction of the support body, and the second mounting hole being arranged at the annular support member; and
   the first fastener arranged in any one of the first mounting holes and the second mounting hole and configured to fix the support body at the annular support, and by positioning the first fastener in different first mounting holes to adjust the magnetic field line direction of the magnetic member and the magnitude of the included angle between the magnetic field line of the magnetic member and the axis of the reaction chamber.

3. The magnetic structure according to claim 2, wherein the outer peripheral surface includes:
   a plurality of sub-planes arranged in sequence along the circumferential direction of the outer peripheral surface, and each of the sub-planes being provided with the first mounting hole.

4. The magnetic structure according to claim 3, wherein:
   the magnetic member is cylindrical;
   the support body has a regular polygonal prism structure; and
   the plurality of the sub-planes form a regular polygonal surface.

5. The magnetic structure according to claim 2, wherein the annular support member includes:
   an upper ring frame;
   a lower ring frame arranged opposite to the upper ring frame in a vertical direction and parallel to the upper ring frame; and a connection member supported between the upper ring frame and the lower ring frame and detachably connected to the upper ring frame and/or the lower ring frame;

wherein:

corresponding to the angle adjustment assembly, the second mounting hole is arranged on at least one of two surfaces of the upper ring frame and the lower ring frame that are opposite to each other; and the support body is fixed between the upper ring frame and the lower ring frame by the first fastener.

6. The magnetic structure according to claim 2, wherein:

accommodation space is arranged in the support body; and the magnetic member is located in the accommodation space;

the accommodation space includes an inner peripheral surface, a plurality of mounting grooves being arranged at intervals on the inner peripheral surface along a circumferential direction of the inner peripheral surface, a mounting member is arranged at a magnetic pole of the magnetic member, the mounting member being cooperated with any one of the mounting grooves to fix the magnetic member in the accommodation space, by cooperating the mounting member with different mounting grooves, the magnetic field line direction of the magnetic member and the magnitude of the included angle between the magnetic field line of the magnetic member and the axis of the reaction chamber being adjusted.

7. The magnetic structure according to claim 6, wherein:

the plurality of the mounting grooves are arranged in pairs;

each pair of the mounting grooves are opposite to each other, the other magnetic pole of the magnetic member is also arranged with a mounting member; and the two mounting members are cooperated with any one pair of mounting grooves, respectively.

8. The magnetic structure according to claim 7, wherein:

the support body has a side surface neighboring to the inner peripheral surface;

an opening communicated with the mounting groove is formed on the side surface;

the opening is configured to move the mounting member into or out of the mounting groove; and a position limiting structure is arranged on the side surface and at the opening and configured to limit the magnetic member in the mounting groove.

9. The magnetic structure according to claim 8, wherein the position limiting structure includes:

a position limiting member stacked on the side surface and blocks the opening, two third mounting holes being arranged on the side surface and on two sides of the opening, respectively, two fourth mounting holes being correspondingly arranged on the position limiting member, and the two fourth mounting holes and the two third mounting holes being arranged coaxially; and two second fasteners being in a one-to-one correspondence with the two third mounting holes, and each of the two second fasteners being mounted in a third mounting hole and a fourth mounting hole that is coaxially arranged with the third mounting hole and configured to fixedly connect the position limiting member and the support body.

10. A semiconductor apparatus comprising:

a reaction chamber; and a magnetic structure arranged around outside of the reaction chamber and including:

an annular support member arranged around the reaction chamber of the semiconductor apparatus;

a plurality of angle adjustment assemblies connected to the annular support member and distributed along a circumferential direction of the annular support member; and a plurality of magnetic members connected to the plurality of angle adjustment assemblies in a one-to-one correspondence, an angle adjustment assembly of the angle adjustment assemblies being configured to fix a corresponding magnetic member of the plurality of magnetic members at the annular support member and adjust a magnetic field line direction of the magnetic member and a magnitude of an included angle between a magnetic field line of the magnetic member and an axis of the reaction chamber;

wherein an angle adjustment assembly of the plurality of angle adjustment assemblies includes:

a support body including a plurality of first mounting holes along a circumferential direction, and a second mounting hole at the annular support member, and a first fastener being placed in any one of the first mounting holes and the second mounting hole to adjust the magnetic field line direction of the magnetic member and the magnitude of the included angle between the magnetic field line of the magnetic member and the axis of the reaction chamber.

11. The magnetic structure according to claim 10, wherein the angle adjustment assembly includes:

the support body configured to support the magnetic member and including an outer peripheral surface, and on the outer peripheral surface, the plurality of first mounting holes being arranged at intervals along a circumferential direction of the support body, and the second mounting hole being arranged at the annular support member; and the first fastener arranged in any one of the first mounting holes and the second mounting hole and configured to fix the support body at the annular support, and by positioning the first fastener in different first mounting holes to adjust the magnetic field line direction of the magnetic member and the magnitude of the included angle between the magnetic field line of the magnetic member and the axis of the reaction chamber.

12. The magnetic structure according to claim 11, wherein the outer peripheral surface includes:

a plurality of sub-planes arranged in sequence along the circumferential direction of the outer peripheral surface, and each of the sub-planes being provided with the first mounting hole.

13. The magnetic structure according to claim 12, wherein:

the magnetic member is cylindrical;

the support body has a regular polygonal prism structure; and the plurality of the sub-planes form a regular polygonal surface.

14. The magnetic structure according to claim 11, wherein the annular support member includes:

an upper ring frame;

a lower ring frame arranged opposite to the upper ring frame in a vertical direction and parallel to the upper ring frame; and a connection member supported between the upper ring frame and the lower ring frame and detachably connected to the upper ring frame and/or the lower ring frame;

wherein:

corresponding to the angle adjustment assembly, the second mounting hole is arranged on at least one of two surfaces of the upper ring frame and the lower ring frame that are opposite to each other; and the support body is fixed between the upper ring frame and the lower ring frame by the first fastener.

15. The magnetic structure according to claim 11, wherein:

accommodation space is arranged in the support body; and the magnetic member is located in the accommodation space;

the accommodation space includes an inner peripheral surface, a plurality of mounting grooves being arranged at intervals on the inner peripheral surface along a circumferential direction of the inner peripheral surface, a mounting member is arranged at a magnetic pole of the magnetic member, the mounting member being cooperated with any one of the mounting grooves to fix the magnetic member in the accommodation space, by cooperating the mounting member with different mounting grooves, the magnetic field line direction of the magnetic member and the magnitude of the included angle between the magnetic field line of the magnetic member and the axis of the reaction chamber being adjusted.

16. The magnetic structure according to claim 15, wherein:

the plurality of the mounting grooves are arranged in pairs;

each pair of the mounting grooves are opposite to each other, the other magnetic pole of the magnetic member is also arranged with a mounting member; and the two mounting members are cooperated with any one pair of mounting grooves, respectively.

17. The magnetic structure according to claim 16, wherein:

the support body has a side surface neighboring to the inner peripheral surface;

an opening communicated with the mounting groove is formed on the side surface;

the opening is configured to move the mounting member into or out of the mounting groove; and a position limiting structure is arranged on the side surface and at the opening and configured to limit the magnetic member in the mounting groove.

18. The magnetic structure according to claim 17, wherein the position limiting structure includes:

a position limiting member stacked on the side surface and blocks the opening, two third mounting holes being arranged on the side surface and on two sides of the opening, respectively, two fourth mounting holes being correspondingly arranged on the position limiting member, and the two fourth mounting holes and the two third mounting holes being arranged coaxially; and two second fasteners being in a one-to-one correspondence with the two third mounting holes, and each of the two second fasteners being mounted in a third mounting hole and a fourth mounting hole that is coaxially arranged with the third mounting hole and configured to fixedly connect the position limiting member and the support body.

* * * * *